United States Patent [19]

Hauptmann

[11] 4,437,059

[45] Mar. 13, 1984

[54] WATTMETER

[75] Inventor: Eric A. Hauptmann, Rochester, N.Y.

[73] Assignee: Rochester Instrument Systems, Inc., Rochester, N.Y.

[21] Appl. No.: 199,379

[22] Filed: Oct. 21, 1980

[51] Int. Cl.³ .................. G01R 11/00; G01R 21/06
[52] U.S. Cl. ............................... 324/142; 324/107; 324/111
[58] Field of Search ............... 324/142, 96, 107, 111, 324/141

[56] References Cited

U.S. PATENT DOCUMENTS

| 3,488,586 | 1/1970 | Watrous et al. | 324/96 |
| 3,500,200 | 3/1970 | Woodhead | 324/142 |
| 3,517,311 | 6/1970 | Wasielewski et al. | 324/142 |
| 3,780,273 | 12/1973 | Turrell | 324/142 |
| 3,900,794 | 8/1975 | Bell | 324/142 |
| 3,953,795 | 4/1976 | Brunner et al. | 324/142 |
| 3,959,724 | 5/1976 | Chana et al. | 324/142 |
| 3,976,942 | 8/1976 | Mayfield | 324/142 |

Primary Examiner—Ernest F. Karlsen
Attorney, Agent, or Firm—Willian, Brinks, Olds, Hofer, Gilson & Lione, Ltd.

[57] ABSTRACT

An electronic wattmeter monitors the current and voltage of power lines and generates unitized voltage pulses at a frequency that is proportional to the average power carried by the lines. The wattmeter includes a current transducer that is inductively coupled to the monitored power lines. The transducer generates an induced current that is representative of the current that flows in the lines. The current transducer includes a magnetically permeable frame which has two magnetically permeable, spaced parallel leg members and a magnetically permeable cross-member that is detachably affixed between the leg members. The monitored power lines pass through an aperture defined by the leg members and cross-member of the frame and the frame additively applies the magnetic fields of the conductors to a coil that is inductively coupled to the frame. The coil generates an induced current corresponding to the current of the conductors. A multiplier samples the induced current at a rate defined by the line voltage and generates an output voltage signal that has an average intensity that is representative of the product of the line voltage and the current of the lines. An integrator successively integrates the output voltage signal of the multiplier to a particular magnitude and generates a unitized pulse for each integration up to the particular magnitude. An optical isolator generates an output signal that is modulated by the unitized pulses of the integrator and that is electrically isolated from the line voltage of the power lines.

19 Claims, 7 Drawing Figures

WATTMETER

TECHNICAL FIELD

The invention relates to wattmeters that are employed to measure the power consumption of electrical systems. More particularly, the invention is directed to an improved wattmeter that may be easily connected to power lines to monitor the current and voltage of the lines and to generate unitized electrical pulses having a frequency that is proportional to the average power that is passed over the lines.

BACKGROUND OF THE INVENTION

Wattmeters have long been employed to monitor the voltage and current of power lines and to indicate the power that is passed by the lines in units of watts or watthours. For example, mechanical watthour meters are now employed by many power companies to measure the amount of power that is used at consumer locations. Such meters are periodically read at the consumer locations by employees of the power company.

It has been suggested that power may be monitored more simply and efficiently by using an electronic wattmeter to continuously transmit measured power to a central monitoring facility. The monitoring facility could then obtain a continuous reading of the power consumption at many remote locations and could use the continuous power measurement to accurately allocate power.

Various wattmeters have been developed to electronically monitor the voltage and current of a power line or lines and to transmit an electrical signal indicating the corresponding power measurement. However, some prior art wattmeters are relatively difficult to install since they can be connected only by breaking or disconnecting a power line. Also, transformers have been used to isolate the voltage and power supply connections of a meter, and such transformers are generally bulky and expensive.

For systems wherein power is both generated and dissipated, it is generally desirable to provide a means for measuring both the magnitude and direction of the flow of power. It is also desirable in some cases to monitor instantaneous power in watts, power usage in watthours and line voltage and current. Moreover, if a wattmeter is to monitor the power conducted over a rigid bus bar, some means must be provided to securely connect the wattmeter to the bar without disrupting the flow of current along the bar.

Accordingly, it is an object of the invention to provide a relatively simple and reliable apparatus for measuring electrical power and for generating an electrical signal corresponding to the magnitude of the measured power.

A further object of the invention is to provide such an apparatus having a current transducer that may be inductively coupled to a power line without disconnecting or cutting the line.

Another object of the invention is to provide a wattmeter apparatus that operates without a voltage transformer or a power supply transformer and that is optically isolated at its output.

A further object of the invention is to provide a wattmeter having a low power dissipation.

Another object of the invention is to provide a meter that generates a signal having a frequency proportional to measured power in watthours, a signal having a duty cycle proportional to measured power in watts and a polarity indicating the direction of the flow of power and signals having duty cycles proportional to line voltage and current.

A further object of the invention is to provide a wattmeter that may be easily connected to a power bus bar without cutting the bar or otherwise disrupting the flow of current along the bar.

BRIEF SUMMARY OF THE INVENTION

In order to achieve the objects of the invention and to overcome the problems of the prior art, the improved wattmeter of the invention employs a current transducer that is inductively coupled to power conductors and that generates an induced current that is proportional to the current that flows in the conductors. The current transducer has two magnetically permeable, spaced parallel leg members and a magnetically permeable crossbar that is detachably affixed between the leg members.

A multiplier circuit is employed to directly monitor the line voltage of the conductors and to receive the induced current of the current transducer. The multiplier circuit generates an output voltage signal that has an average intensity that is proportional to the product of the line voltage and the current of the conductors.

An integrator is connected to the multiplier and operates to generate unitized pulses at a freuency that is proportional to the average power supplied by the conductors.

A light emitting diode is connected to the integrator and is operated to generate pulses of radiation that correspond to the unitized pulses of the integrator. A phototransistor generates an electrical output pulse in response to each of the radiation pulses.

In an embodiment of the invention, a coupling screw is supported by the crossbar of the current transducer of the wattmeter. The wattmeter is securely engaged with a power bus bar by positioning the bar between the parallel leg members of the current transducer and turning the coupling screw until the end of the screw presses the bar against a face of the wattmeter.

A duty cycle modulator may be connected to the multiplier and operated to generate a signal having a duty cycle that is proportional to instantaneous power in watts and a polarity that indicates the direction of the flow of power.

Means may be provided to rectify line current and voltage and to generate two signals with duty cycles that are respectively proportional to the magnitude of the line current and the line voltage.

DETAILED DESCRIPTION OF PREFERRED EMBODIMENTS

Figure 1:
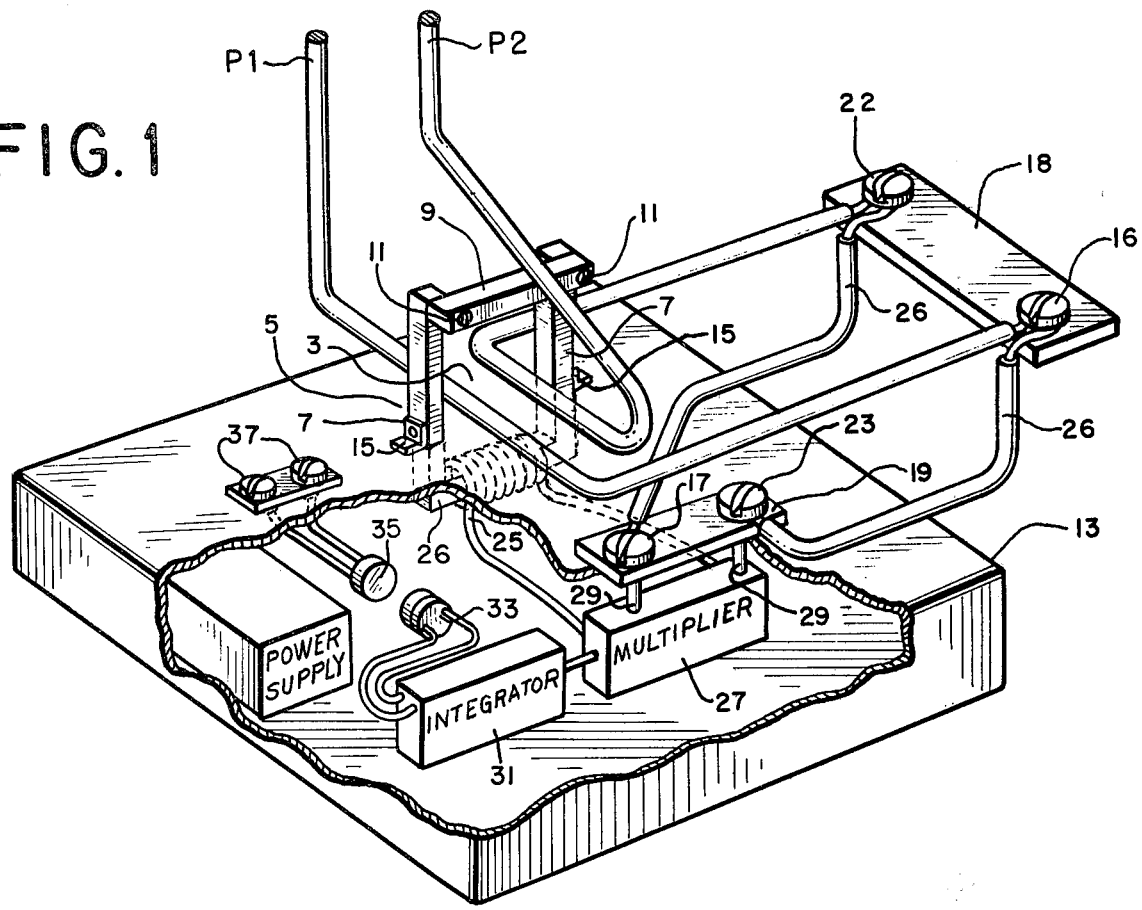
FIG. 1 illustrates a perspective view in partial section of a preferred embodiment of a wattmeter, in accordance with the invention.

The remaining portion of this specification will describe preferred embodiments of the invention when read in conjunction with the attached drawings, in which like reference characters identify identical apparatus.

FIG. 1 illustrates a perspective view in partial section of a wattmeter, in accordance with the invention. The wattmeter of FIG. 1 operates to monitor the voltage and current of two AC power lines P1 and P2. The current of one line is 180° out of phase with respect to the current of the other line. Such power transmission lines are relatively common, for example in supplying power to private homes and typically, a neutral line is provided with the power lines. However, the neutral line is not shown, since it need not be connected to the embodiment of FIG. 1.

As shown in FIG. 1, the lines P1 and P2 are routed through an opening 3 of a magnetically permeable frame 5. The frame 5 has a magnetically permeable crossbar 9 that is detachably affixed to legs 7, for example by screws 11.

The legs 7 of the frame 5 are affixed to the surface of a housing 13 by brackets 15 which may be affixed to the legs and housing by screws. The line P1 extends through the central opening 3 of the frame 5 and is engaged with a terminal screw 16 of a remote terminal block 18 that may be located, for example, in the power distribution box of a house that is serviced by the lines P1 and P2. The line P2 is positioned to pass through the opening 3 in a direction opposite the direction of the line P1 and is connected to a second terminal screw 22 of the terminal block 18.

The lines P1 and P2 are passed in opposite directions through the opening 3 so that the magnetic fields of the lines additively induce current in the frame 5. Thus, even though the lines P1 and P2 conduct current in opposite directions, the current of the lines travels in the same direction at the point at which the lines pass through the opening 3. The lines P1 and P2 may be looped around the frame in the indicated opposite directions any number of times to increase the magnitude of the induced current and to thereby increase the sensitivity of the wattmeter to low level input currents.

Wires 26 connect the screws 16 and 22 to corresponding screws 17 and 23 that are supported on the top surface of the housing 13 by a terminal plate 19. The screws 17 and 23 extend through holes in the top of the housing and are conductively connected to a multiplier circuit 27 by wires 29. The multiplier circuit 27 is also conductively connected to a coil 25 that is supported on a lower bar 26 of the frame 5. The output of the multiplier 27 is connected to the input of an integrator circuit 31 and the output of the integrator is connected to a light emitting diode (LED) 33. The LED is optically coupled to a phototransistor 35 that is conductively connected to output terminal screws 37.

In operation, the multiplier 27 generates a product signal that is proportional to the product of the voltage and current of the lines P1 and P2. The product signal is applied to the integrator 31 which successively integrates the product signal to a particular product magnitude and generates a unitized electrical pulse for each successive integration. Thus, each unitized pulse of the integrator corresponds to a particular value of average power in watthours.

The integrator circuit 31 applied each of its unitized electrical pulses to the LED 33 and the LED generates a corresponding pulse of radiation. Each radiation pulse of the LED 33 is sensed by the phototransistor 35 and a corresponding electrical signal is generated and applied to the output terminals 37. The terminals 37 may be connected to cables (not shown) that carry the signals to a remote monitor.

It should be understood that the lines P1 and P2 may be properly positioned with respect to the opening 3 of the frame 5, even if the ends of the lines are not available for insertion through the opening. More particularly, the crossbar 9 may be disconnected from the legs 7 by removing the screws 11 and the cables may then be positioned as shown. Thereafter, the crossbar 9 may be affixed to the ends of the leg 7 by the screws 11.

Figure 2:
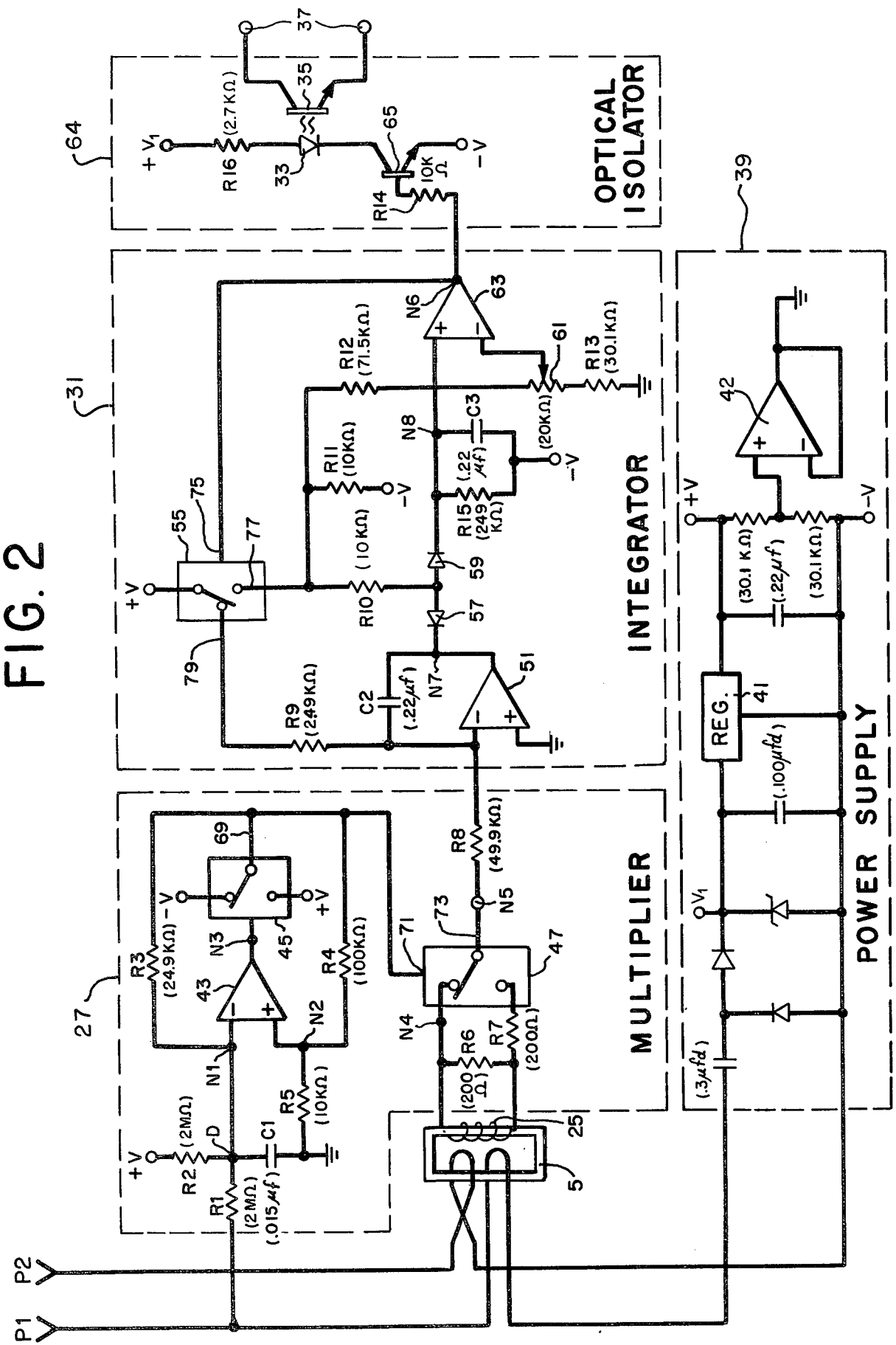
FIG. 2 illustrates a circuit diagram of the electrical components of the wattmeter of FIG. 1.

FIG. 2 illustrates a circuit diagram of a preferred embodiment of the multiplier, integrator, power supply and current transducer of the invention. The input power lines P1 and P2 each typically carry current in a range of from 50 to 100 amperes, at a voltage of about 240 volts between P1 and P2, or 120 volts between a neutral line and either P1 or P2. The frame 5 is inductively coupled to the coil 25 so that the coil generates an induced current that is representative of the current that flows in the lines P1 and P2. For the circuit of FIG. 2, the coil 25 may have a sufficient number of turns to provide an induced current of about 200 ma. The power lines P1 and P2 are also connected to a DC power supply 39 which generates voltages $+V$ and $-V$ that supply the various electrical components of the circuit. The power supply includes a regulator 41 that maintains a constant output voltage. Diodes, capacitors and resistors of the supply are arranged to rectify the AC input and to further stabilize the DC output. An operational amplifier 42 is provided to establish a floating ground for the power supply. The power supply 39 has a reactive component at its input rather than a resistive component in order to reduce the power dissipation of the supply and to thereby provide a more efficient operation for the apparatus of the invention.

In the circuit of FIG. 2, scaling resistors R1 and R2 are provided so that the line P1 may be directly connected to an input operational amplifier 43 of the multiplier 27. It will be appreciated by those skilled in the art that the voltage input connection for the multiplier 27 is an improvement over voltage input schemes of the prior art, since an input voltage transformer is not required in the circuit of the invention. It should also be understood that the resistors R1 and R2 not only provide a scaling function for the input voltage of the circuit but also define a zero current steady state condition for the input of the multiplier. Thus, a current will flow from a common node D of the resistors R1 and R2 only when there is a change in the magnitude of the signal applied from the power line P1.

The voltage input signal of the common node D is applied to the inverting input of the operational amplifier 43 and the output of the operational amplifier 43 is connected to the control input terminal of an analog switch 45 that switches in accordance with the logic voltage level at the output of the operational amplifier. Such switches are known to the art and are commercially available. For example, Motorola manufactures a CMOS analog switch which is generally designated CED14053. The input terminals of the analog switch 45 are respectively connected to the +V and −V voltage of the power supply 39 and the common switching terminal of the switch 45 is connected to feedback resistors R3 and R4 and to the control terminal of a second analog switch 47.

The feedback resistor R3 is connected to the inverting input of the operational amplifier 43 and the feedback resistor R4 is connected to the non-inverting input of the operational amplifier 43. The feedback resistor R4 is also connected to one end of a voltage divider resistor R5 that is connected at its other end to a control capacitor C1. The control capacitor C1 is connected between the circuit ground and the common node D of the resistors R1 and R2.

The frame 5 and coil 25 form a current transducer wherein the frame 5 is inductively coupled to the coil. The frame 5 applies the magnetic fields of the lines P1 and P2 to additively induce current in the coil. The ends of the coil 25 are connected by a resistor R6 and one end of the resistor R6 is connected to an input terminal of the analog switch 47. The other end of the resistor R6 is connected to ground and to one end of a resistor R7 that is connected at its other end to a second input terminal of the analog switch 47.

A common switching terminal 73 of the analog switch 47 is connected to one end of an output resistor R8 that is connected at its other end to the inverting input of an integrating operational amplifier 51 of the integrator 31. The non-inverting input of the operational amplifier 51 is connected to ground and the output of the amplifier is connected to one end of an integrating capacitor C2. The other end of the capacitor C2 is connected to the inverting input of the operational amplifier 51 and to one end of a resistor R9. The other end of the pull-up resistor R9 is connected to an input terminal 79 of an analog switch 55.

The output of the operational amplifier 51 is connected to the cathode of a diode 57. The anode of othe diode 57 is connected to the anode of another diode 59 and to one end of a resistor R10. The other end of the resistor R10 is connected to an input terminal 77 of the analog switch 55 and to one end of a pull-down resistor R11 that is connected at its other end to −V.

The pull-down resistor R11 is also connected to a resistor R12 that is connected in series with a potentiometer 61 and a resistor R13 that is connected to ground. The control terminal of the potentiometer 61 is connected to the inverting input of an operational amplifier 63 and the output of the operational amplifier 63 is connected to the base of a transistor 65 through a resistor R14. The output of the operational amplifier 63 is also connected to the control terminal 75 of the analog switch 55. The non-inverting input of the operational amplifier 63 is connected to the cathode of the diode 59 and to one end of a resistor R15 and a capacitor C3. The other ends of the resistor R15 and the capacitor C3 are connected to −V of the power supply 39.

The collector of the transistor 65 is connected to the cathode of the light-emitting diode 33 and the anode of the diode is connected to +V through a resistor R16. As indicated above, the light-emitting diode 33 is optically coupled to a phototransistor 35 that is connected to the output terminals 37.

Figure 3:
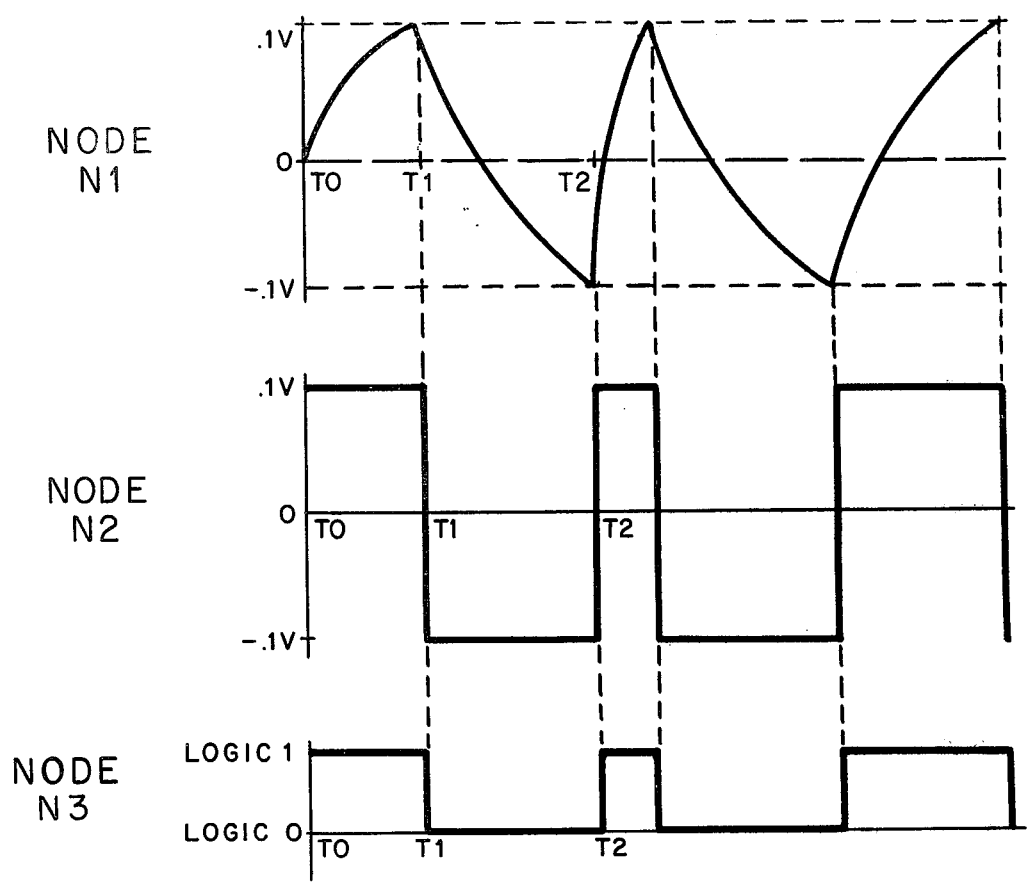
FIG. 3 illustrates a timing diagram of operational signals for the multiplier of the circuit of FIG. 2.
Figure 4:
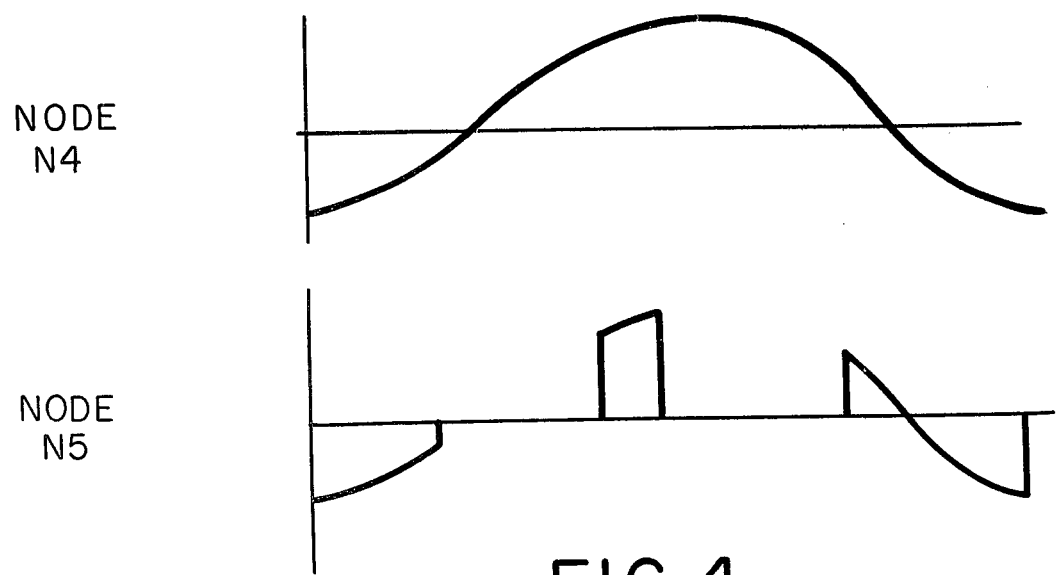
FIG. 4 illustrates a timing diagram of the input and output signals of the multiplier of the circuit of FIG. 2.
Figures 5, 7:
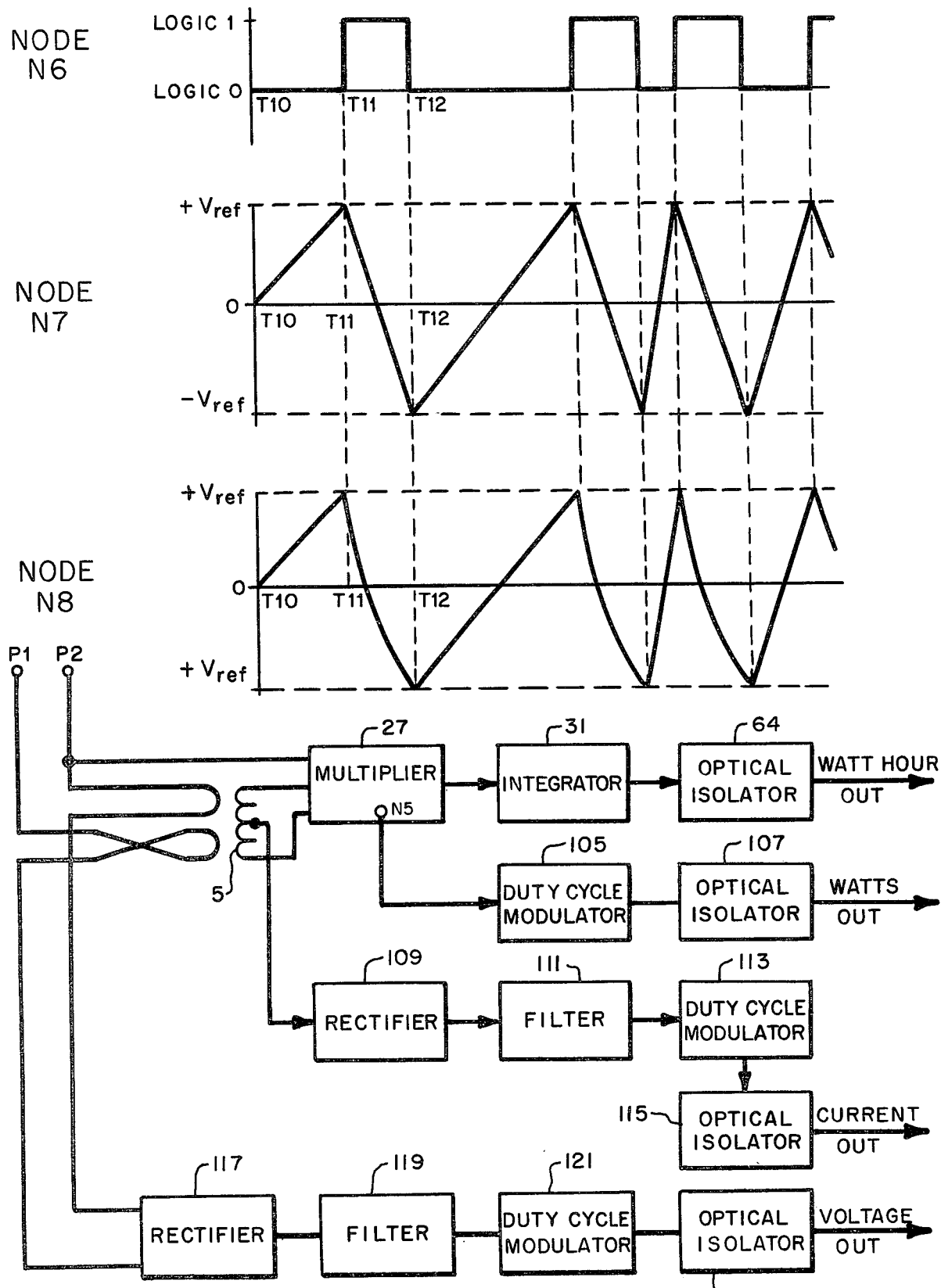
FIG. 5 illustrates a timing diagram of operational signals for the integrator of the circuit of FIG. 2.
FIG. 7 illustrates a block diagram of a wattmeter that generates signal representing line voltage and current, instantaneous power in watts, and power usage in watthours.

The operation of the circuit diagram of FIG. 2 will hereafter be described with respect to operational signals that are illustrated in the timing diagrams of FIGS. 3, 4 and 5, wherein the magnitude of each signal is plotted along a vertical axis and the time period of the signal is plotted along a horizontal axis. Also, the operation of the circuit of FIG. 2 will be described for electrical components having the values indicated in parenthesis adjacent to each component. It should be appreciated that the indicated component values are provided to facilitate an understanding of the invention and to particularly describe a preferred embodiment of the invention and, therefore, do not limit the scope of the invention, as defined in the claims.

The multiplier 27 of FIG. 2 monitors the voltage of the line P1 and the sum of the currents of the lines P1 and P2 and operates to generate an average voltage that is proportional to the product of the voltage and current of the lines, thereby indicating the power consumption in watts. In operation, the AC signal of the line P1 causes a corresponding scaled voltage and current to be applied at the common node D of the resistors R1 and R2. If it is assumed as an initial condition that the output N3 of the operational amplifier 43 at a time T0 is a logic 1 or high voltage, as shown in FIG. 3, then the analog switch 45 is operated to connect its switching terminal 69 to +V.

The +V voltage of the switching terminal 69 causes a positive current to be applied at a circuit node N1 at the inverting input of the operational amplifier 43 and a reference voltage of approximately 0.1 V to be applied at a circuit node N2 of the non-inverting input of the operational amplifier 43. The positive current at the node N1 and the signal at the node D causes the capacitor C1 to charge and thereby defines a positive exponential voltage ramp at the node N1.

As shown in FIG. 3, the signal at the node N1 is a positive exponential voltage ramp from the initial time T0 until a later time T1 at which the positive voltage at the inverting input of the operational amplifier 43 equals the positive reference voltage at the node N2 of the non-inverting input of the operational amplifier. When the voltage at N1 equals the voltage at N2, the voltage at the output N3 of the operational amplifier drops to the indicated zero logic state. The logic zero of the operational amplifier causes the analog switch 45 to connect its switching terminal 69 to −V.

The −V voltage at the switching terminal 69 establishes a negative bias current at the node N1 and a negative reference voltage at the node N2 that is approximately equal to −0.1 V. The negative current at the node N1 and the signal at the node D from the line P1 causes the capacitor C1 to charge to define a negative exponential ramp from the time T1 to a subsequent time T2. As the voltage at the node N1 exponentially ramps negatively, the voltage approaches the negative reference voltage at the node N2. When the voltage at the node N1 is equal to the negative reference voltage at the node N2, the output of the operational amplifier 43 switches to a positive logic state and thereby causes the analog switch 45 to apply +V at the switching terminal 69.

It should be understood that the time period required for the capacitor C1 to charge between the indicated reference voltages of 0.1 V and −0.1 V is determined by the magnitude of the voltage that is applied from the line P1. Also, it should be appreciated that the varying switching of the analog switch 45 under the control of the operational amplifier 43 causes a square wave signal of varying duty cycle to be applied to the control terminal 71 of the switch 47. The operation of the multiplier circuit 27 of FIG. 2 is such that the duty cycle of the square wave at the control terminal 71 is proportional to the magnitude of the voltage that is applied from the line P1.

The switching terminal 73 of the analog switch 47 is switched between the input terminals of the switch in accordance with the duty cycle of the square wave signal at the control terminal 71. Thus, for example, when a positive voltage is applied at the control terminal 71, the switch terminal 73 is connected to receive a voltage proportional to the induced current from the current transducer frame 5. Likewise, when the signal at the terminal 71 is negative, the switch terminal 73 is connected to ground. Thus, the duty cycle operation of the switch 47 causes a chopped signal to be generated at the switching terminal 73.

FIG. 4 illustrates a typical 60 HZ input voltage signal at a node N4 of the switch 47 and the corresponding chopped output voltage signal at a node N5. For clarity of illustration, the relatively low frequency 60 HZ signal of FIG. 4 has been shown on a time axis that has a different scale than the time axis of the operational signals of FIGS. 3 and 5, which have a frequency in the range of 2 KHZ.

It should be understood that the switch 47 operates to multiply the voltage and current of the lines P1 and P2 by selectively sampling a voltage that corresponds to the current of the lines at a duty cycle that is proportional to the voltage of the lines. Thus, for the indicated values of the components of FIG. 2, the chopped product voltage at the node N5 is a voltage having an average negative magnitude that is proportional to the product of the current and voltage of the lines P1 and P2.

The integrator 31 of FIG. 2 receives the product voltage signal of the multiplier 27, integrates the signal and generates a unitized pulse for each integration of the signal up to a particular value. Thus, each unitized pulse at the output of the integrator corresponds to a particular fixed magnitude of energy that was generated over a time period measured between the generated unitized pulse and the preceding pulse.

The integrator of FIG. 2 will hereafter be described with respect to control signals that are illustrated in FIG. 5. The operation of the integrator 31 may best be understood with reference to an initial condition at a time T10 wherein the output N6 of the operational amplifier 63 is a voltage sufficiently negative to apply a logic low to the control terminal 75 of the switch 55. The low voltage at the control terminal 75 causes the switch to connect the input terminal 77 to +V. The +V voltage at the input terminal 77 forward biases the diodes 57 and 59 and defines a positive voltage Vref at the inverting input of the operational amplifier 63. The positive voltage Vref has a value of approximately ⅓ V volts that is determined by the setting of the potentiometer 61.

When the switch 55 is selected in the above-indicated mode, the negative product voltage at the node N5 causes the output N7 of the integrating operational amplifier 51 to ramp in a positive direction as the capacitor C2 charges. Since the diodes 57 and 59 are forward biased by the positive voltage of the terminal 77, the voltage at the non-inverting input N8 of the operational amplifier 63 follows the voltage at N7 and thereby charges the capacitor 63. When the voltage at N7 and N8 is equal to the voltage at the inverting input of 63, for example at a time T11, the output N6 of the amplifier rises to a positive logic one voltage.

The logic one voltage at N6 causes the switch 55 to remove the +V voltage from the terminal 77 and to connect the +V voltage to the opposite terminal 79 of the switch. When the positive voltage is removed from the terminal 77 at the time T11, the pull-down resistor R11 causes a negative voltage −Vref of approximately −⅓ V volts to be applied by the potentiometer 61 to the inverting input of the operational amplifier 63 and also reverse biases the diodes 57 and 59 so that N8 is isolated from N7.

When the reverse biased diodes 57 and 59 isolate N8 from N7, the capacitor 63 begins to discharge at a rate that is determined by the RC time constant of the capacitor and associated resistor R15. Thus, from a time T11 the voltage at N8 will ramp down until the voltage at the non-inverting input of the operational amplifier is equal to the −Vref voltage at the inverting input. At a time T12 when the voltage at the non-inverting input is equal to the voltage at the inverting input, the output N6 of the operational amplifier drops to a logic zero voltage.

It should be appreciated that the positive pulse at the output of the operational amplifier 63 will have a unitized pulse width that is determined by the reference voltage of the potentiometer 61 and the RC time constant of the capacitor C3 and resistor R15. It should also be understood that the unitized pulse at the output of the operational amplifier 63 corresponds to a particular value of charge that is stored on the integrating capacitor C2. As indicated above, the charge on the integrating capacitor C2 corresponds to a particular value of energy, representative of power.

When the switch 55 is operated at the time T11 to apply a +V voltage at the terminal 79, the +V voltage positively biases the inverting input of the operational amplifier 51 so that the varying negative product voltage at N5 causes a corresponding varying positive voltage to be applied at the inverting input of the operational amplifier 51. When the varying positive voltage is applied at the inverting input of the operational amplifier 51, the output N7 of the amplifier is caused to ramp downwardly until, at the time T12, the switch 55 is operated by the low logic level at the node N6 to remove the +V voltage from the terminal 79.

It should be appreciated that the integrator 31 of FIG. 2 will operate cyclically in the above-indicated fashion to generate unitized electrical pulses at the output of the operational amplifier 63. The unitized pulses will have a frequency that is proportional to average power. In practice, the potentiometer 61 of the integrator is adjusted so that a unitized pulse will represent a particular known quantity of energy and so that the average current that flows through the resistor R8 will equal the average current that flows through R9. Accordingly, the average power, as represented by the average voltage at the inverting input of the operational amplifier 51, may be computed in the following manner:

Average Power/R8 = ((Vref × Pulse Width)/Pulse Period)/R9

But: Pulse width is proportional to R × C, where R is the value in ohms of R15 and C is the value in farads of the capacitor C3.

And: F = 1/Period

Therefore: Average Power = (R × C × Vref × F × R8)/R9

Accordingly, it should be appreciated that the average power of the lines P1 and P2 is defined as the product of a constant times the frequency of the unitized pulses at the output of the operational amplifier 63.

The unitized pulses of the operational amplifier 63 are applied to an optical isolator 64. The optical isolator 64 has a transistor 65 that receives the unitized pulses at its base and that conducts in response to each pulse. The conducting transistor energizes the light-emitting diode 33 so that the diode emits a pulse of radiation. The radiation of the diode 33 is transmitted to an optically coupled phototransistor 35 that generates a voltage at the output terminals 37 for each radiation pulse that is detected. The optical coupling of the circuit of FIG. 2 isolates the output signals of the circuit with respect to the electrical signals of the lines P1 and P2. Alternatively, the output signals may be isolated by a pulse transformer.

It should be understood that isolation transformers may be connected at the input to the power supply 39 and at the input to the multiplier 27. If such isolation transformers are provided, optical isolation at the output is not required and, therefore, the transistor 65 and associated light-emitting diode and phototransistor may be omitted.

Moreover, although a duty cycle multiplier and a charge balanced integrator have been described for a preferred embodiment of the invention, it should be understood that other known multiplier and integrator circuits may be employed. Also, it should be appreciated that the operation of the multiplier 27 may be easily changed so that the current of the lines P1 and P2 determines the duty cycle of the switch 47 and the voltage of the lines is selectively sampled in accordance with the duty cycle.

More particularly, it will be appreciated by those skilled in the art that the duty cycle modulator of the multiplier of FIG. 2 may be replaced by a hall effect multiplier, height-width triangle wave multiplier, semiconductor transconductance multiplier, or log/antilog multiplier. Also, a known voltage-to-frequency converter may be used to replace the charge balance integrator of FIG. 2.

The single phase power system of FIG. 2 is shown with both "hot" input power lines P1 and P2 connected to the power supply 39. However, it will be appreciated by those skilled in the art that the P2 line of FIG. 2 may be connected to a neutral wire and either of the hot lines of the system may be connected to supply the power supply voltages and the input voltage signal for the operational amplifier 43. For such a circuit configuration, both hot lines would be connected as shown in FIG. 2 to supply the induced current for the frame 5. A system having a single hot wire would be connected in a similar manner to provide the power supply voltages and the input voltage signal. However, only the single hot wire would be connected to the frame 5 to provide the induced current signal.

The wattmeter of the invention may be employed to measure the power of a line or lines in a system having any number of lines and phases. Thus, a plurality of wattmeters may be used to monitor the power of a multiple line system. In such a system, the power readings of the wattmeters would be summed to derive the total power of the system.

Figure 6:
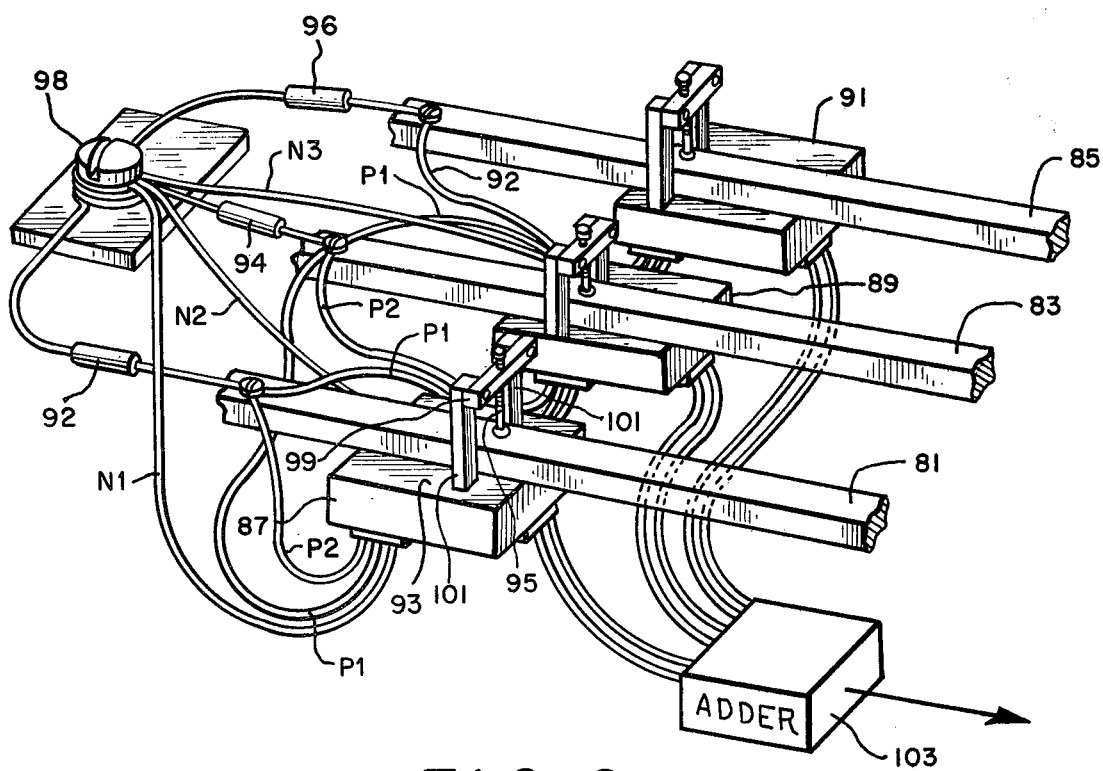
FIG. 6 illustrates a perspective view of a three phase power measuring system, in accordance with the invention.

FIG. 6 illustrates a three line, three phase power system, such as is used in stations that generate electrical power. In the system of FIG. 6, power is supplied over rigid bus bars 81, 83 and 85, and wattmeters 87, 89 and 91 respectively measure the magnitude of the power carried by the bars. The power measurements of the wattmeters 87, 89 and 91 are added by an adder 103 which provides an electrical signal that indicates the power of the entire system.

Each of the wattmeters 87, 89 and 91 is easily clamped to an associated bus bar and connected for measuring the power of the bar. It should be understood that each wattmeter may be connected to its bus bar without breaking or cutting the bar or otherwise interrupting the operation of the power system.

In operation, the wattmeter 87 is affixed to the bus bar 81 by disengaging a magnetically permeable crossbar 99 of a magnetically permeable frame 93 and positioning the wattmeter so that the bar 81 passes between upstanding posts 101 of the frame. The crossbar 99 is then reconnected to the upstanding posts 101 and a coupling screw 95, which passes through a threaded hole in the crossbar 99, is turned until the end of the screw engages the bus bar 81 and presses the bar against the surface of the wattmeter. The wattmeters 89 and 91 are clamped to their respective bus bars 83 and 85 in the same manner.

Each of the wattmeters 87, 89 and 91 has a circuit that operates in the manner described for the circuit of FIG. 2, to generate unitized electrical pulses at a frequency that is proportional to the measured power. However, since a three phase power system is employed, the input connections for the circuits of the wattmeters of FIG. 6 are somewhat different than the input connections shown for the circuit of FIG. 2.

More particularly, each of the wattmeters of FIG. 6 is connected to a neutral input line that is formed by connecting the buses 81, 83 and 85 through respective resistors 92, 94 and 96 to a common point, for example a terminal screw 98. The neutral terminal 98 is then connected to the wattmeters 87, 89 and 91 by respective neutral lines N1, N2 and N3.

Each wattmeter is also connected to its respective bus bar and to one of the other bus bars. Thus, for example, the wattmeter 87 is connected to the neutral line N1, its bus 81 and another bus 83. However, it should be understood that the connection to the bus 83 may be changed to a connection to the bus 85, without departing from the invention.

The input connections for the wattmeter 87 will now be described with respect to the circuit of FIG. 2. FIG. 2 shows two input lines P1 and P2 that supply power and input voltage and current signals to the circuit. For the circuit of the wattmeter 87, the line P2 is connected to the bus 81 over which power is measured and the line P1 is connected to an additional bus, for example bus 83. It should be appreciated that, since current is only monitored on the line P2 (bus 81), the line P1 is no longer coupled to the magnetically permeable frame of the wattmeter 87. The resistor R1 is connected to the neutral line N1 of the wattmeter 87, rather than to the line P2.

Thus, the lines P1 and P2 energize the power supply of the circuit, the bus 81 (P2) supplies induced current to the frame 93 and the neutral line N1 is connected to the operational amplifier 43 to provide the input voltage signal. It should be understood that the wattmeters 89 and 91 are connected in a similar fashion to receive their input signals. Thus, the circuit of the wattmeter 89 has a line P2 connected to the bus 83, a line P1 connected to another bus, for example the bus 81, and a neutral line N2 connected through a resistor R1 to the operational amplifier 43. Likewise, the wattmeter 91 has a line P2 connected to the bus 85, a line P1 connected to another bus, for example 83, and a neutral line N3 connected to the operational amplifier 43 through a resistor R1.

Each of the wattmeters 87, 89 and 91 generates optically isolated, unitized pulses having a frequency that is proportional to the magnitude of the power that is passed by the respective bus bars 81, 83 and 85. The adder 103 may be a frequency adder that operates in a known manner to sum the frequencies of the signals and to generate an output signal corresponding to the total power that is passed by the bus bars 81, 83 and 85.

Although the resistors 92, 94 and 96 are shown outside the respective wattmeters 87, 89 and 91, it should be understood that the resistors may be connected inside the wattmeters, without changing the operation of the circuit of the invention. Thus, the resistor 92 may be placed in the wattmeter 87 and connected between the neutral line N1 and the line P2 of the wattmeter. Likewise, the resistor 94 may be connected between N2 and P2 of the wattmeter 89 and the resistor 96 may be connected between N3 and P2 of the wattmeter 91. If the resistors 92, 94 and 96 are connected internally, the neutral lines N1, N2 and N3 may either be directly connected to the terminal screw 98, or connected to the terminal screw through additional resistors.

FIG. 7 shows a block diagram of the components of a meter that is used to generate signals corresponding to the average current and voltage, wattage and watthours of power lines P1 and P2. The multiplier 27, integrator 31 and optical isolator 64 of the meter operate as shown in FIG. 2 to generate unitized pulses corresponding to the watthours for the lines P1 and P2. The wattage of the lines is indicated by applying the product voltage signal at the node N5 of the circuit of FIG. 2 to a duty cycle modulator 105 that generates a signal having a duty cycle that is proportional to the magnitude of the product signal or wattage of the lines.

The duty cycle modulator 105 may be constructed in the manner shown for the duty cycle modulator portion of the multiplier 27 of FIG. 2. Thus, the modulator 105 will have circuit components connected in the manner shown for the operational amplifier 43, analog switch 45, capacitor C1 and resistors R1, R3, R4 and R5 of the multiplier 27 of FIG. 2. The modulator 105 will not require a scaling resistor corresponding to the resistor R2, since the voltage at the node N5, rather than the line voltage, will be applied to the modulator.

The signals of the duty cycle modulator 105 are passed to an optical isolator 107 that operates in the manner of the isolator 64. The signals at the output of the isolator 107 have a duty cycle that is proportional to the wattage of the lines and a polarity that indicates the direction of the flow of power.

It will be appreciated by those skilled in the art that wattage may be derived from the frequency of the unitized pulses at the output of the isolator 64. However, the direction of power flow may not be determined by the frequency measurement, since the unitized pulses have a fixed polarity.

The current of the lines P1 and P2 is determined by using a rectifier 109 to rectify a portion of the induced current of the frame 5 and a known filter 111 to smooth the rectified signal. The rectified, filtered signal is then applied to a duty cycle modulator 113 that operates in the manner of the modulator 105 to generate a signal with a duty cycle that is proportional to the magnitude of the current of the lines P1 and P2. The output signal of the modulator 113 is isolated by an optical isolator 115.

The voltage of the lines P1 and P2 is determined by connecting the lines P1 and P2 to a rectifier circuit 117, filtering the rectified output signal with a known filter 119 and duty cycle modulating the rectified and filtered signal with a modulator 121 that operates in the manner of the modulator 105. The output signal of the modulator 121 is then isolated by the operation of an associated optical isolator 123.

The invention may be embodied in other specific forms without departing from its spirit or essential characteristics. The present embodiments are, therefore to be considered in all respects as illustrative and not restrictive. The scope of the invention is indicated by the claims rather than by the foregoing description and, accordingly, all changes which come within the meaning and range of the equivalents of the claims are intended to be embraced therein.

I claim:

1. A wattmeter for measuring the power passed by conductor means, comprising:
   current sensing means for measuring the instantaneous current flowing in said conductor means and for generating an induced current representative of the current flowing in the conductor means;
   voltage sensing means for sampling the instantaneous voltage of said conductor means with respect to a voltage reference;
   multiplier means responsive to the current sensing means and voltage sensing means for generating a product signal representative of the instantaneous power passed by the conductor means;
   integrator means for integrating said product signal and generating a pulsed control signal with pulses having a frequency proportional to the average power passed by said conductor means, said integrator means including,
   means for integrating said product signal after each pulse of the pulsed control signal is generated and for generating a sum signal representative of the sum of the integrated product signal and a predefined power correction factor;
   means for generating each pulse of said pulsed control signal for a predefined time interval when the magnitude of the sum signal is representative of a predefined value of power; and
   means for defining a value of said power correction factor representative of measured power during said predefined time interval.

2. The wattmeter of claim 1 wherein said multiplier includes,
   means for generating a sampling signal having a duty cycle proportional to the line voltage of said conductor means, and
   means for sampling said induced current at a rate defined by said sampling signal to generate said product signal.

3. The wattmeter of claim 1 wherein said multiplier means includes,
   a capacitor for charging and discharging in accordance with the line voltage of said conductor means to define a varying control voltage,
   amplifier means for generating a first switch control signal when said control voltage is greater than a first reference voltage and for generating a second switch control signal when said control voltage is equal to a second reference voltage, switch means responsive to said switch control signals for defining on and off duty cycle portions of a duty cycle signal and for defining said reference voltages and the charge or discharge state of said capacitor, and means for sampling said induced current at a rate defined by said duty cycle signal.

4. The wattmeter of claim 1 further including a power supply means for receiving power directly from said conductor means and for generating particular operational voltages, said supply means having at least one reactance input component for generating said particular operational voltages with a minimum power dissipation.

5. The wattmeter of claim 1, including, switch means for turning on and off in response to said pulsed control signal, emitter means for emitting radiation when said switch means is turned on, and means for generating an electrical signal in response to the radiation of the emitter means.

6. The wattmeter of claim 1 wherein said current sensing means includes two magnetically permeable spaced parallel leg members, a magnetically permeable cross-member, and means for detachably connecting said cross-member between said leg members, the cross-member being detached to position at least a portion of said conductor means to pass between said leg members and reattached so that the conductor means extends through an area bounded by the leg members and cross-member.

7. The wattmeter of claim 1 further including means for generating a power output signal having a duty cycle proportional to the magnitude of said product signal.

8. The wattmeter of claim 1 further including means for rectifying said sensed voltage and current and means for generating a first output signal having a duty cycle proportional to the magnitude of the rectified current and a second output signal having a duty cycle proportional to the magnitude of the rectified voltage.

9. The wattmeter of claim 1 wherein said current sensing means includes means for detachably inductively coupling to at least a portion of said conductor means.

10. The wattmeter of claim 1 further including a housing and means for clamping at least a portion of said conductor means against the housing.

11. The wattmeter of claim 1 wherein said current transducer includes, a coil for generating a current in response to the magnetic field of said conductor means, and a magnetically permeable frame for supporting said coil and for passing the magnetic field of said conductor means to said coil, said frame having an aperture, and means for detaching at least a portion of the frame to allow at least a portion of the conductor means to be positioned to extend through the aperture.

12. The wattmeter of claim 1, wherein said means for defining includes control means for defining a power measuring operational state and a power indicating operational state for the integrator means, the power measuring state defined for a power measuring interval and the power indicating state defined for said predefined time interval;

said means for integrating includes a first accumulator means responsive to said control means for storing an electrical charge representative of the integral of said product signal during said power measuring interval and for discharging to a value of charge representative of a power correction value of said product signal during said predefined time interval; and said means for generating includes a second accumulator means for storing an electrical charge representative of the integral of said product signal during said power measuring interval and for discharging its stored charge over a time period defining said predefined time interval;

switch means responsive to said control means for conductively connecting said first and second accumulator means during said power measuring interval and for electrically isolating the accumulator means from each other during said predefined time interval; and comparator means for generating said pulsed control signal, each pulse of the pulsed control signal having a width equal to the predefined time interval for each accumulation of a predefined charge by said second accumulator means, the predefined charge corresponding to a particular reference value of power.

13. The wattmeter of claim 12, wherein said first accumulator means includes a power compensation capacitor, said second accumulator means includes a timing capacitor, and said switch means includes at least two diodes connecting the capacitors, said control means forward biasing the diodes to conductively connect the capacitors during the power measuring interval and reverse biasing the diodes to electrically isolate the capacitors during the power indicating interval.

14. The wattmeter of claim 13, including a reference means for defining a first and a second reference voltage, said comparator means including an operational amplifier and means for connecting one input of the amplifier to said timing capacitor and another input to said reference means, the amplifier operating to define a leading edge of a pulse of said pulsed control signal when the timing capacitor charges to a voltage equal to the first reference voltage and a trailing edge of the pulse when the timing capacitor discharges to a voltage equal to said second reference voltage.

15. The wattmeter of claim 13, wherein said control means includes a solid state switch for defining said operational states in response to each pulse of said comparator means.

16. In a polyphase power distribution system of a type wherein a plurality of conductor means distribute polyphase current at a voltage referenced across the conductor means, a plurality of improved wattmeters for measuring the power passed by said conductor means, each of said wattmeters comprising:

a housing;

a current sensing means for generating an induced current representative of the current passing through said conductor means, said current sensing means including, a coil for generating said induced current in response to a magnetic field of said conductor means, and a magnetically permeable frame for applying the magnetic field of the conductor means to the coil, the frame having an aperture and means for detaching at least a portion of the frame to allow the conductor means to be positioned to extend through the aperture;

means for clamping said conductor means to said housing;

multiplier means responsive to said current sensing means and the level of said voltage for generating a product signal representative of the instantaneous power passed by the conductor means;

integrator means responsive to said product signal for generating a pulsed control signal representative of the average power passed by said conductor means, said integrator means including, means for integrating said product signal after each pulse of the pulsed control signal is generated and for generating a sum signal representative of the sum of the integrated product signal and a predefined power correction factor;

means for generating each pulse of said pulsed control signal for a predefined time interval when the magnitude of the sum signal is representative of a predefined value of power; and means for defining a value of said power correction factor representative of measured power during said predefined time interval.

17. The improved wattmeter of claim 16 wherein said means for clamping is a screw and said frame includes means for supporting the screw so that as the screw is tightened, a free end of the screw engages and presses said conductor means against said housing.

18. The improved wattmeter of claim 16 further including means for generating a power output signal having a duty cycle proportional to the magnitude of said product signal.

19. The improved wattmeter of claim 16 further including means for rectifying said voltage and current and means for generating a first output signal having a duty cycle proportional to the magnitude of the rectified current and a second output signal having a duty cycle proportional to the magnitude of the rectified voltage.

* * * * *

UNITED STATES PATENT AND TRADEMARK OFFICE
CERTIFICATE OF CORRECTION

PATENT NO. : 4,437,059
DATED : March 13, 1984
INVENTOR(S) : Eric A. Hauptmann

It is certified that error appears in the above-identified patent and that said Letters Patent is hereby corrected as shown below:

Column 1, line 49, after "bar" insert --,--.

Column 3, line 2, delete "signal" and insert therefor --signals--.

Column 4, line 5, delete "applied" and insert therefor --applies--.

Column 5, line 2, delete "CED" and insert therefor --CD--.

Column 5, line 40, delete "othe" and insert therefor --the--.

Column 7, line 65, delete "63" and insert therefor --C3--.

Column 8, line 12, delete "63" and insert therefor --C3--.

Column 8, line 65, after "Power=(RXCX" delete "-".

Signed and Sealed this

Eighth Day of April 1986

[SEAL]

Attest:

DONALD J. QUIGG

*Attesting Officer*  *Commissioner of Patents and Trademarks*